(12) United States Patent
Lu et al.

(10) Patent No.: US 9,996,013 B2
(45) Date of Patent: *Jun. 12, 2018

(54) EXTREME ULTRAVIOLET LITHOGRAPHY PROCESS AND MASK

(71) Applicant: TAIWAN SEMICONDUCTOR MANUFACTURING COMPANY, LTD., Hsin-Chu (TW)

(72) Inventors: Yen-Cheng Lu, New Taipei (TW); Jeng-Horng Chen, Hsin-Chu (TW); Shinn-Sheng Yu, Hsinchu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 17 days.

This patent is subject to a terminal disclaimer.

(21) Appl. No.: 15/194,072

(22) Filed: Jun. 27, 2016

(65) Prior Publication Data

US 2016/0306272 A1    Oct. 20, 2016

Related U.S. Application Data

(63) Continuation of application No. 14/047,341, filed on Oct. 7, 2013, now Pat. No. 9,377,696.

(51) Int. Cl.
| | |
|---|---|
| *G03B 27/54* | (2006.01) |
| *G03B 27/62* | (2006.01) |
| *G03F 7/20* | (2006.01) |
| *G03F 1/24* | (2012.01) |
| *G03F 1/48* | (2012.01) |
| *G03F 1/54* | (2012.01) |

(52) U.S. Cl.
CPC ............ *G03F 7/70283* (2013.01); *G03F 1/24* (2013.01); *G03F 1/48* (2013.01); *G03F 1/54* (2013.01); *G03F 7/2004* (2013.01); *G03F 7/703* (2013.01); *G03F 7/70091* (2013.01); *G03F 7/70158* (2013.01)

(58) Field of Classification Search
CPC .. G03F 7/70258; G03F 7/70091; G03F 7/702; G03F 7/70158; G03F 7/70283; G03F 7/703; G03F 1/22; G03F 1/24; G03F 1/48
USPC ............... 355/30, 52, 53, 55, 67–71, 75–77; 250/492.1, 492.2, 492.22, 493.1, 548; 430/5, 8, 22, 30, 311, 312
See application file for complete search history.

(56) References Cited

U.S. PATENT DOCUMENTS

| | | |
|---|---|---|
| 2004/0091789 A1 | 5/2004 | Han |
| 2006/0240334 A1 | 10/2006 | Huh |

(Continued)

*Primary Examiner* — Christina Riddle
(74) *Attorney, Agent, or Firm* — Haynes and Boone, LLP

(57) ABSTRACT

An extreme ultraviolet lithography (EUVL) system is disclosed. The system includes an extreme ultraviolet (EUV) mask with three states having respective reflection coefficient is $r_1$, $r_2$ and $r_3$, wherein $r_3$ is a pre-specified value that is a function of r1 and r2. The system also includes a nearly on-axis illumination (ONI) with partial coherence σ less than 0.3 to expose the EUV mask to produce diffracted light and non-diffracted light. The system further includes a projection optics box (PUB) to remove a portion of the non-diffracted light and to collect and direct the diffracted light and the remaining non-diffracted light to expose a target.

20 Claims, 6 Drawing Sheets

(56) References Cited

U.S. PATENT DOCUMENTS

| | | | |
|---|---|---|---|
| 2007/0121090 A1* | 5/2007 | Chen | G03F 1/34 355/67 |
| 2007/0154817 A1 | 7/2007 | Leunissen | |
| 2008/0311486 A1 | 12/2008 | Itoh | |
| 2009/0220869 A1 | 9/2009 | Takai | |
| 2011/0287344 A1 | 11/2011 | Irie | |
| 2013/0260288 A1 | 10/2013 | Yu | |

* cited by examiner

EXTREME ULTRAVIOLET LITHOGRAPHY PROCESS AND MASK

CROSS-REFERENCE TO RELATED APPLICATION

The present application is a continuation of U.S. patent application Ser. No. 14/047,341, entitled "An Extreme Ultraviolet Lithography Process and Mask," filed Oct. 7, 2013, the entire disclosure of which is hereby incorporated by reference.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses. EUV scanners provide the desired pattern on an absorption layer ("EUV" mask absorber) formed on a reflective mask. Currently, binary intensity masks (BIM) accompanied by on-axis illumination (ONI) are employed in EUVL. In order to achieve adequate aerial image contrast for future nodes, e.g., nodes with the minimum pitch of 32 nm and 22 nm, etc., several techniques, e.g., the attenuated phase-shifting mask (AttPSM) and the alternating phase-shifting mask (AltPSM), have been developed to obtain resolution enhancement for EUVL. But each technique has limitations. For example, for AltPSM, one of the methods to generate a phase-shifting region without significant attenuation in reflectivity is to create a step of appropriate height on a substrate and then form a multilayer (ML) over the step. However, the ML tends to smooth out the step height, leading to a large transition area between phase-shifting and non-phase-shifting regions. This will limit the achievable resolution limit. So it is desired to have further improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
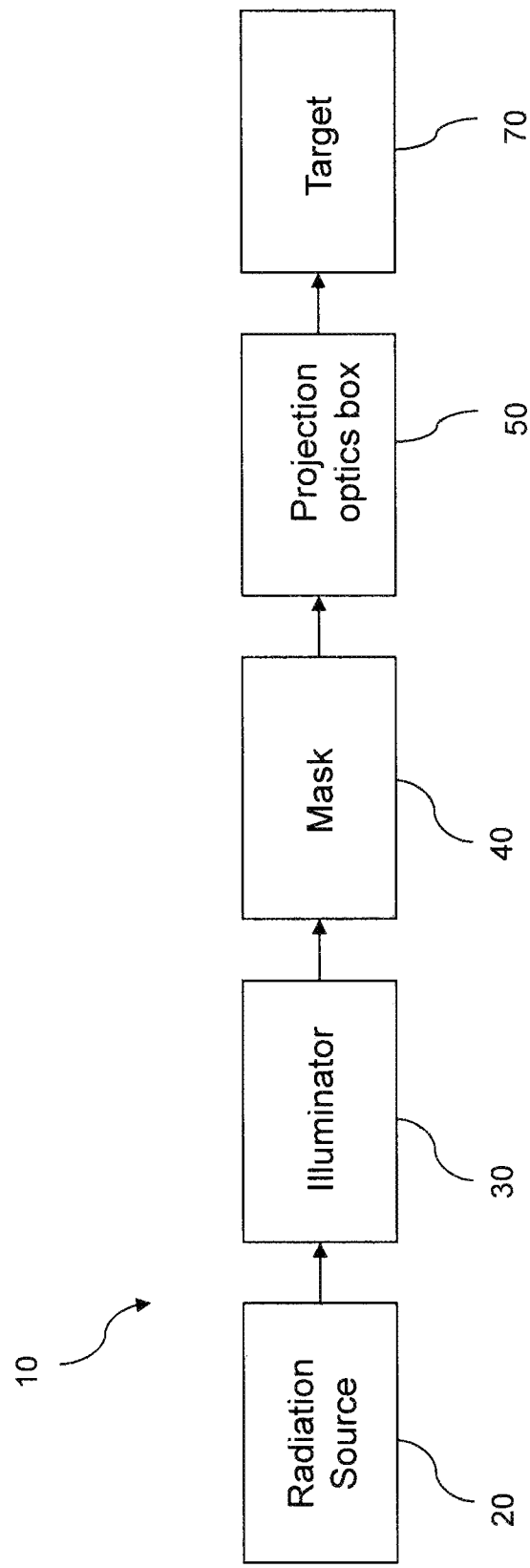
FIG. 1 is a block diagram of a lithography system for implementing one or more embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, an EUV lithography system 10 that may benefit from one or more embodiments of the present invention is disclosed. The EUV lithography system 10 employs an EUV radiation source 20 having a wavelength of about 1-100 nm.

The EUV lithography system 10 also employs an illuminator 30. The illuminator 30 may comprise refractive optics, such as a single lens or a lens system having multiple lenses (zone plates) and/or reflective optics, such as a single mirror or a mirror system having multiple mirrors in order to direct light from the radiation source 20 onto a mask 40. In the EUV wavelength range, reflective optics is employed generally. Refractive optics, however, can also be realized by e.g., zoneplates. In the present embodiment, the illuminator 30 is set up to provide a on-axis illumination (ONI) to illuminate the mask 40. In ONI, all incoming light rays incident on the mask at the same angle of incidence (AOI), e.g., AOI=6°, as that of the chief ray. In real situation, there may be some angular spread of the incident light. For example, if a disk illumination (i.e., the shape of the illumination on the pupil plane being like a disk centered at the pupil center) of a small partial coherence σ, e.g., σ=0.3, is employed, the maximum angular deviation from the chief ray is $\sin^{-1}[m \times \sigma \times NA]$, where m and NA are the magnification and numerical aperture, respectively, of the imaging system (i.e., the projection optics box (POB) 50 to be detailed below). Partial coherence σ can also be used to describe a point source which produces a plane wave illuminating the mask 40. In this case, the distance from the pupil center to the point source in the pupil plane is $NA \times \sigma$ and the AOI of the corresponding plane wave incident on the mask 40 is $\sin^{-1}[m \times \sigma \times NA]$. In the present embodiment, it is sufficient to employ a nearly ONI consists of point sources with σ less than 0.3.

The EUV lithography system 10 also employs the mask 40 (in the present disclosure, the terms of mask, photomask, and reticle are used to refer to the same item). The mask 40 can be a transmissive mask or a reflective mask. In the present embodiment, the mask 40 is a reflective mask such as described in further detail below. The mask 40 includes a plurality of main features (main polygons), such as circuit patterns. The rest region without main patterns is referred to as field. The mask 40 may incorporate other resolution enhancement techniques such as phase-shifting mask (PSM) and/or optical proximity correction (OPC).

The EUV lithography system 10 also employs a POB 50. The POB 50 may have refractive optics or reflective optics. The radiation reflected from the mask 40 (e.g., a patterned radiation) is collected by the PUB 50. The PUB 50 may include a magnification of less than one (thereby reducing the patterned image included in the radiation).

Figure 2:
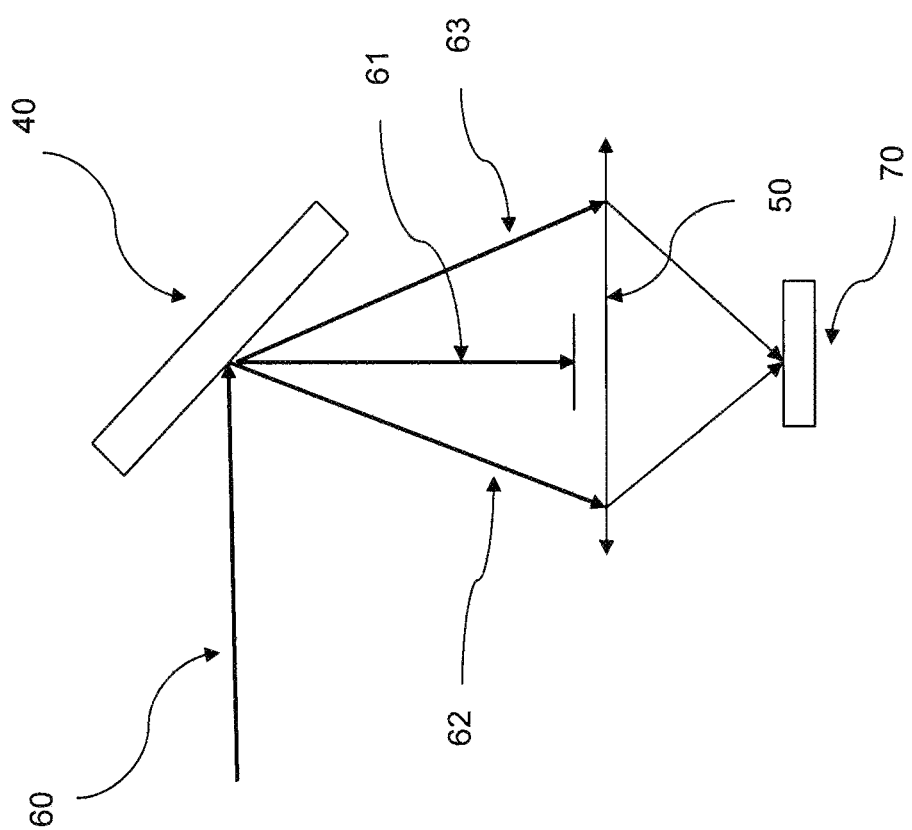
FIG. 2 is a diagrammatic perspective view of a projection optics box (POB) employed in the lithography system for implementing one or more embodiments of the present disclosure.

Referring to FIG. 2, an incident light ray 60, after being reflected from the mask 40, is diffracted into various diffraction orders due to presence of these mask patterns, such as a 0-th diffraction order ray 61, a −1-st diffraction order ray 62 and a +1-st diffraction order ray 63. For lithographic imaging, purely coherent illumination is generally not employed. Disk illumination with partial coherence σ being at most 0.3 generated by the illuminator 30 is employed. In the depicted embodiment, the non-diffracted light rays 61 are mostly (e.g., more than 70%) removed by, e.g., central obscuration in the pupil plane. The −1-st and +1-st diffraction order rays, 62 and 63, are collected by the PUB 50 and directed to expose a target 70. Since the strength of the −1-st and +1-st diffraction order rays, 62 and 63, are well balanced, they interfere with each other and will generate a high contrast aerial image. Also, the −1-st and +1-st diffraction order rays, 62 and 63, are of the same distance from the pupil center in the pupil plane, and depth of focus (DOF) is maximized.

The target 70 includes a semiconductor wafer with a photosensitive layer (e.g., photoresist or resist), which is sensitive to the EUV radiation. The target 70 may be held by a target substrate stage. The target substrate stage provides control of the target substrate position such that the image of the mask is scanned onto the target substrate in a repetitive fashion (though other lithography methods are possible).

The following description refers to the mask 40 and a mask fabrication process. The mask fabrication process includes two steps: a blank mask fabrication process and a mask patterning process. During the blank mask fabrication process, a blank mask is formed by depositing suitable layers (e.g., multiple reflective layers) on a suitable substrate, The blank mask is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

In general, various masks are fabricated for being used in various processes. Types of EUV masks include binary intensity mask (BIM) and phase-shifting mask (PSM). An example BIM includes an almost totally absorptive region (also referring to as an opaque region) and a reflective region. In the opaque region, an absorber is present and an incident light beam is almost fully absorbed by the absorber. The absorber can be made of materials containing chromium, chromium oxide, chromium nitride, aluminum-copper, titanium, titanium nitride, titanium oxide, tantalum, tantalum oxide, tantalum nitride, and tantalum boron nitride, or any suitable matrials. In the reflective region, the absorber is removed and the incident light is reflected by a multilayer (ML), which will be described in further detail below. A PSM includes an absorptive region and a reflective region. A portion of the incident light reflects from the absorptive region with a proper phase difference with respect to a light reflected from the reflective region to enhance the resolution and imaging quality. The absorber of the PSM can be made by materials such as tantalum nitride and tantalum boron nitride at a specific thickness. The PSM can be attenuated PSM (AttPSM) or alternating PSM (AltPSM). An AttPSM usually has 2%-15% of reflectivity from its absorber, while an AltPSM usually has larger than 50% of reflectivity from its absorber.

Figure 3:
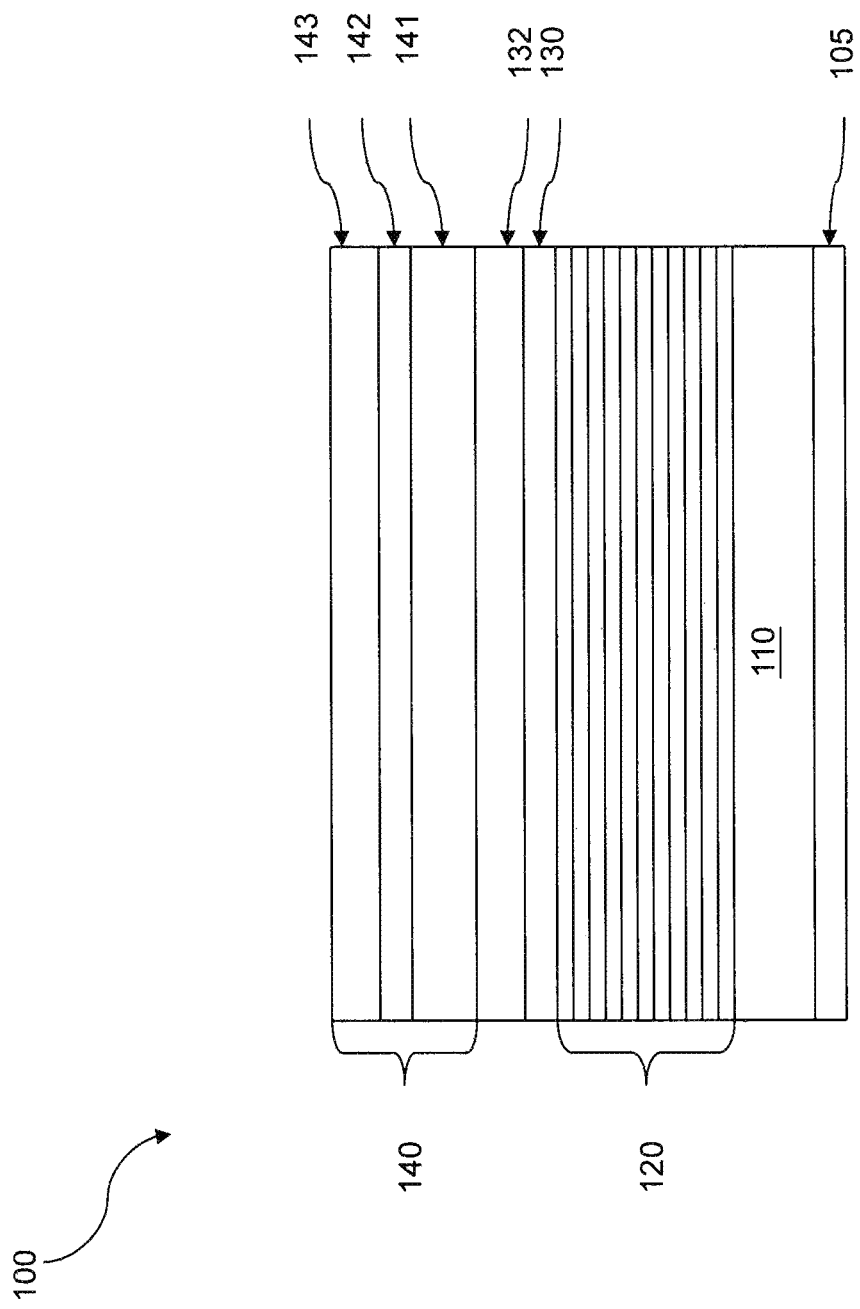
FIGS. 3-5 are diagrammatic cross-sectional views of various aspects of one embodiment of an EUV mask at various stages of a lithography system constructed according to aspects of the present disclosure.

Referring to FIG. 3, an EUV mask substrate 100 comprises a material layer 110 made of low thermal expansion material (LTEM). The LTEM may include $TiO_2$ doped $SiO_2$, and/or other low thermal expansion materials known in the art. The LTEM layer 110 serves to minimize image distortion due to mask heating. In the present embodiment, the LTEM layer 110 includes materials with a low defect level and a smooth surface. In addition, a conductive layer 105 may be deposed under (as shown in the figure) the LTEM layer 110 for the electrostatic chucking purpose. In an embodiment, the conductive layer 105 includes chromium nitride (CrN), though other compositions are possible.

A reflective multilayer (ML) 120 is deposed over the LTEM layer 110. According to Fresnel equations, light reflection will occur when light propagates across the interface between two materials of different refractive indices. The reflected light is larger when the difference of refractive indices is larger. To increase the reflected light, one may also increase the number of interfaces by deposing a multilayer of alternating materials and let lights reflected from different interfaces interfere constructively by choosing appropriate thickness for each layer inside the multilayer. However, the absorption of the employed materials for the multilayer limits the highest reflectivity that can be achieved. The ML 120 includes a plurality of film pairs, such as molybdenum-silicon (Mo/Si) film pairs (e.g., a layer of molybdenum above or below a layer of silicon in each film pair). Alternatively, the ML 120 may include molybdenum-beryllium (Mo/Be) film pairs, or any material that is highly reflective at EUV wavelengths can be utilized for the ML 120. The thickness of each layer of the ML 120 depends on the EUV wavelength and the incident angle. The thickness of the ML 120 is adjusted to achieve a maximum constructive interference of the EUV light reflected at each interface and a minimum absorption of the EUV light by the ML 120. The ML 120 may be selected such that it provides a high reflectivity to a selected radiation type/wavelength. A typical number of film pairs is 20-80, however any number of film pairs is possible. In an embodiment, the ML 120 includes forty pairs of layers of Mo/Si. Each Mo/Si film pair has a thickness of about 7 nm, with a total thickness of 280 nm. In this case, a reflectivity of about 70% is achieved.

A capping layer 130 is formed over the ML 120 to prevent oxidation of the ML. In the present embodiment, the capping layer 130 includes ruthenium (Ru) with about 2.5 nm thickness.

A buffer layer 132 is formed over the capping layer 130. The buffer layer includes ruthenium (Ru), Ru compounds such as RuB and RuSi, chromium (Cr), Cr oxide, and Cr nitride. Alternatively, the capping layer 130 and the buffer layer 132 can be replaced by a single layer.

In the present embodiment, an absorption stack 140 is formed over the buffer layer 132. The absorption stack 140 preferably absorbs radiation in the EUV wavelength range projected onto a patterned EUV mask 200. The absorption stack 140 includes multiple film layers from a group consisting of tantalum (Ta), tantalum nitride (TaN), tantalum boron nitride (TaBN), titanium, aluminum oxide, aluminum-copper, palladium, molybdenum (Mo), or other suitable materials. In one embodiment, the absorption stack 140 is formed by a first Mo layer 141 as a bottom layer/a Ta layer 142 as a middle layer/a second Mo layer 143 as a top layer, as shown in FIG. 3.

One or more of the layers 105, 120, 130, 132, and 140 may be formed by various methods, including physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art. The MOD is a deposition technique by using a liquid-based method in a non-vacuum environment. By using MOD, a metal-organic precursor, dissolved in a solvent, is spin-coated onto a substrate and the solvent is evaporated. A vacuum ultraviolet (VUV) source is used to convert the metal-organic precursors to constituent metal elements.

Figure 4:
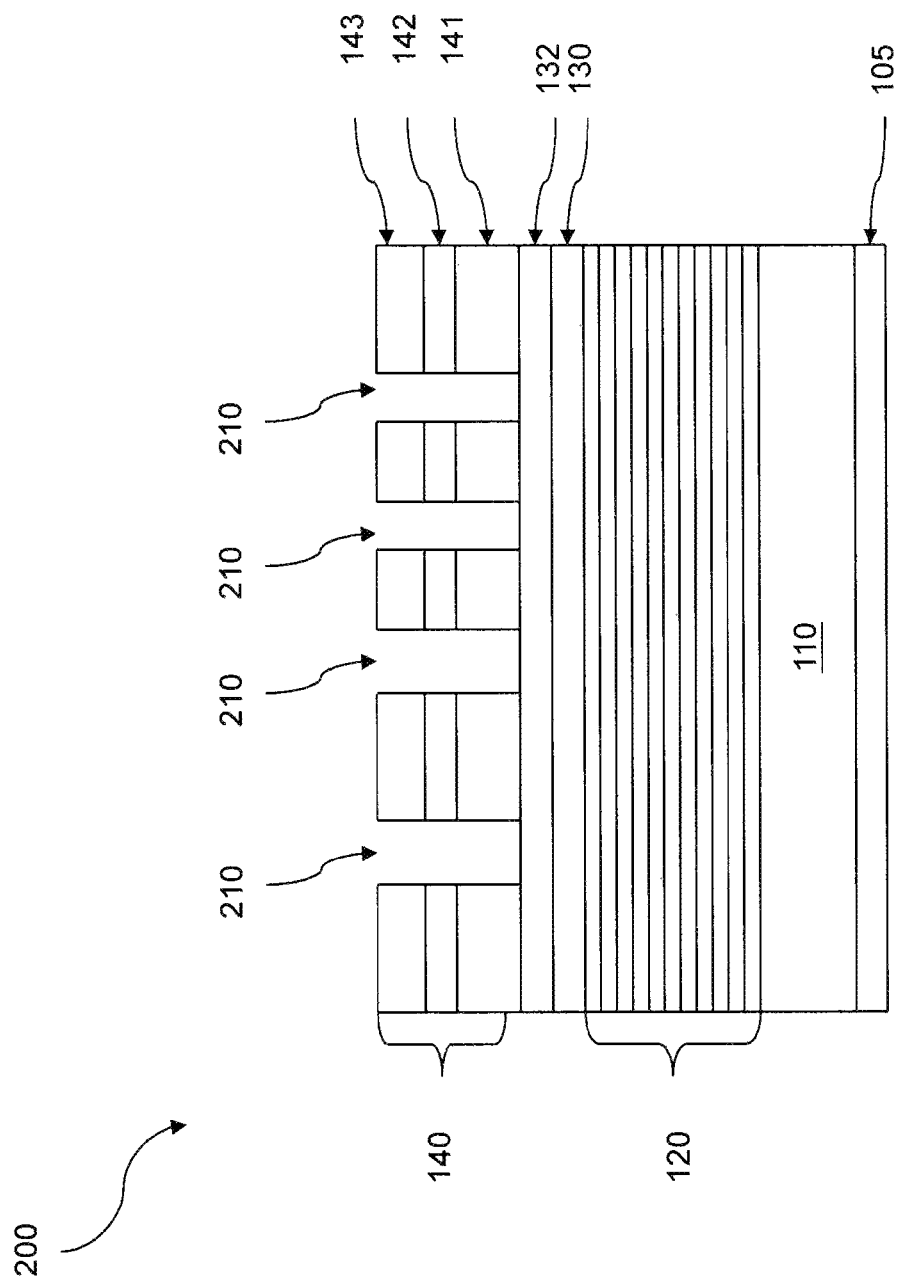

Referring to FIG. 4, in one of the present embodiments, the absorption stack 140 is patterned to form the design layout pattern EUV mask 200 with three states on the blank mask 100. The absorption stack 140 is patterned to form a first state 210 having a first reflection coefficient $r_1$ by patterning technique. A patterning process may include resist coating (e.g., spin-on coating), soft baking, mask aligning, exposure, post-exposure baking, developing the resist, rinsing, drying (e.g., hard baking), other suitable processes, and/or combinations thereof. Alternatively, the photolithography exposing process is implemented or replaced by other proper methods such as maskless photolithography, electron-beam writing, direct-writing, and/or ion-beam writing.

An etching process is performed next to remove portions of the absorption stack 140 and form the first state 210. The etching process may include dry (plasma) etching, wet etching, and/or other etching methods. In one embodiment, a multiple-step dry etching is implemented. For example, a plasma etching starts to remove the second Mo layer 143 by a fluorine-based gas, then proceeds to a second etching step to remove the first Ta layer 142 by a chlorine-based gas, and then proceeds to a third etching step to remove the first Mo layer 141 by a fluorine-based gas.

Figure 5:
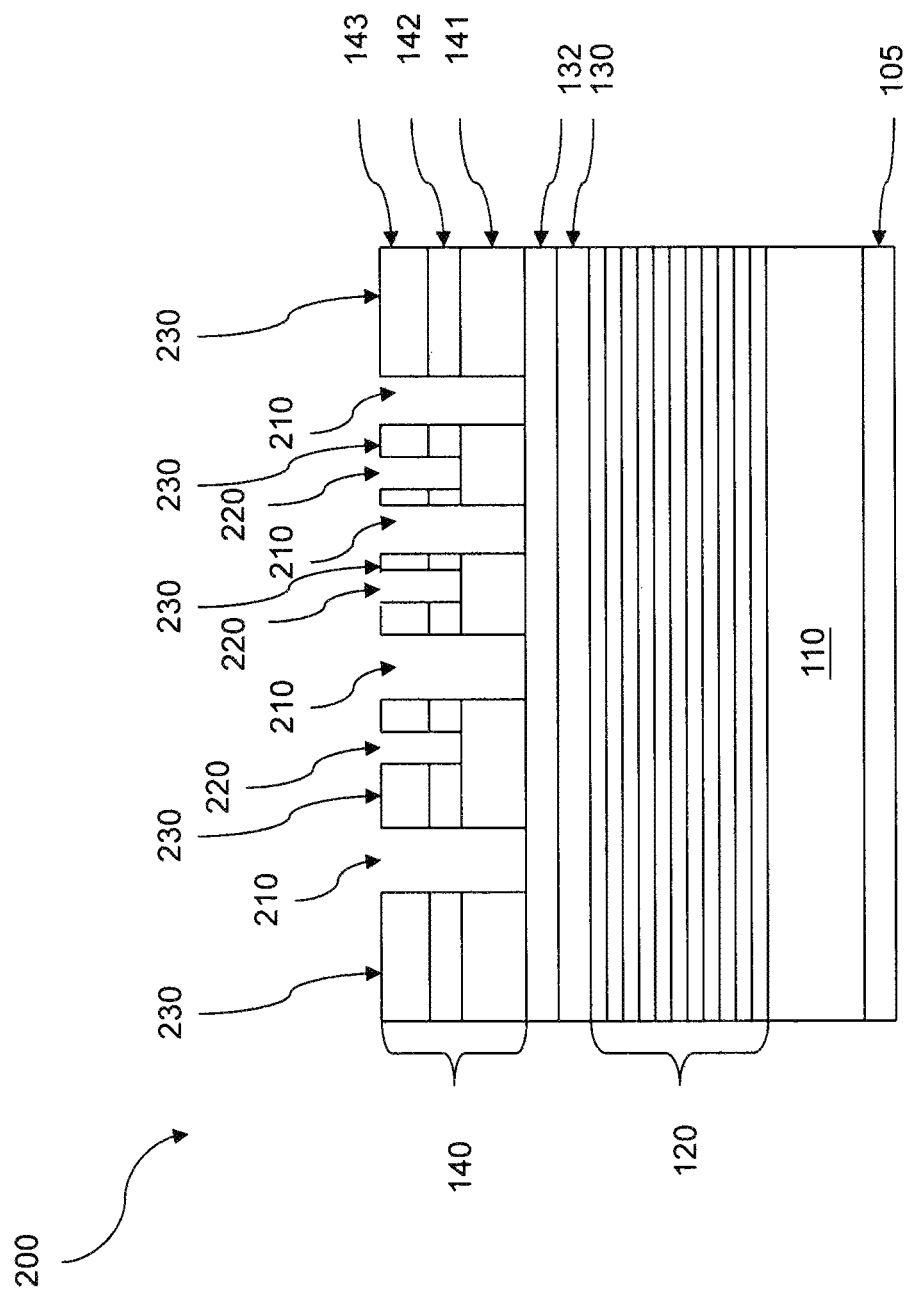

Referring to FIG. 5, a second state 220 having a second reflection coefficient $r_2$ on the EUV mask 200 is formed by another patterning and etching processes, similar in many respects to those discussed above in association with the formation of the first state 210 except it removes different portion of the absorption stack 140. As an example, the second Mo layer 143 and the first Ta layer 142 are removed in the etching process to form the second state 220.

Still referring to FIG. 5, now the EUV mask 200 comprises three states, 210, 220 and 230. The reflection coefficients of the first state 210, the second state 220, and the third state 230 are $r_1$, $r_2$ and $r_3$, respectively. In the present embodiment, by choosing a proper configuration of each layer of the absorption stack 140, such as film material and film thickness, three states can achieve prespecified values of the reflection coefficients, such as $r_3=(r_1+r_2)/2$. In one embodiment, the first state 210 is configured as (in order from top to bottom) the buffer layer 132/the capping layer 130/the ML 120/the LTEM layer 110, the second state 220 is configured as 44-nm Mo/the buffer layer 132/the capping layer 130/the ML 120/the LTEM layer 110, and the third state 230 is configured as 21.5-nm Mo/40-nm Ta/44-nm Mo/the buffer layer 132/the capping layer 130/the ML 120/the LTEM layer 110. The third state 230 can also be configured as 21-nm Mo/47.5-nm TaN/44-nm Mo/the buffer layer 132/the capping layer 130/the ML 120/the LTEM layer 110 or as 21.5-nm Mo/46.9-nm TaBN/44-nm Mo/the buffer layer 132/the capping layer 130/the ML 120/the LTEM layer 110.

Figure 6:
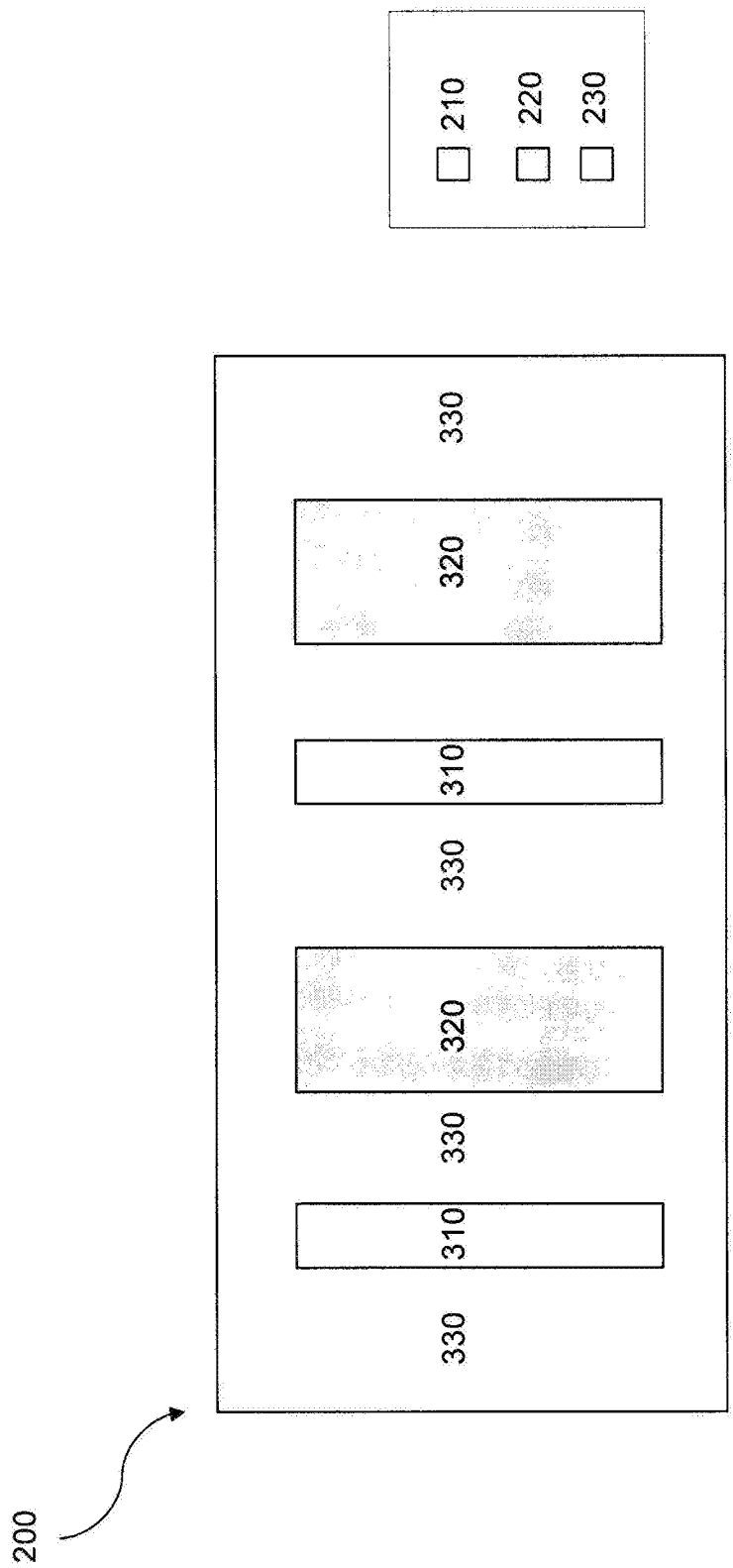
FIG. 6 is a diagrammatic perspective view of an EUV mask according to aspects of the present disclosure.

Referring to FIG. 6, the EUV mask 200 includes main polygons, such as a polygon 310 and a polygon 320, and a field 330. In the present embodiment, state 210 has light grey background, state 220 has dark grey background, state 230 has white background, as illustrated in the figure legend. States 210 and 220 of the EUV mask 200 are assigned to adjacent polygons 310 and 320, respectively. The third state 230 is assigned to the field 330. By assigning different states to adjacent polygons and sub-resolution polygons, it will reduce the spatial frequency of mask patterns and improve aerial image contrast and process window.

Based on the above, it can be seen that the present disclosure offers the EUV lithography system 10. The EUV lithography system 10 employs a nearly ONI, e.g., a disk illumination with partial coherence σ smaller than 0.3 to expose an EUV mask to produce diffracted light and non-diffracted light. The EUV lithography system 10 removes more than 70% of the non-diffracted light and utilizes mainly the diffracted light from two symmetrically located (on the pupil plane) and intensity balanced −1st and +1st diffraction orders to expose a semiconductor wafer. The EUV lithography system 10 also employs an EUV mask having three states, namely the first state, the second state, and the third state with pre-specified reflection coefficients $r_1$, $r_2$, and $r_3$, respectively, wherein $r_3$ is close to $(r_1+r_2)/2$. The first and the second states are assigned to adjacent polygons, while the third state is assigned to the field. The EUV lithography system 10 demonstrates a better pattern contrast and throughput. The EUV lithography system 10 provides a resolution enhancement technique for future nodes.

The present disclosure is directed towards lithography system and processes. In one embodiment, an extreme ultraviolet lithography (EUVL) system includes an extreme ultraviolet (EUV) mask with three states having reflection coefficients $r_1$, $r_2$, and $r_3$, respectively. $r_3$ is close to $(r_1+r_2)/2$. The system also includes a nearly on-axis illumination (ONI) with partial coherence σ less than 0.3 to expose the EUV mask to produce diffracted light and non-diffracted light. The system also includes a projection optics box (POB) to remove most of non-diffracted light and collect and direct the diffracted light and the not removed non-diffracted light to expose a target.

In another embodiment, an EUVL process includes receiving an extreme ultraviolet (EUV) mask. The EUV mask includes a first polygon, a second polygon adjacent to the first polygon, a field (a region without polygons), a first state having reflection coefficient $r_1$, a second state having reflection coefficient $r_2$ and a third state having reflection coefficient $r_3$. $r_3$ is close to $(r_1+r_2)/2$. The first state is assigned to the first polygon, the second state is assigned to the second polygon and the third state is assigned to the field. The process also includes exposing the EUV mask by a nearly on-axis illumination (ONI) with partial coherence a less than 0.3 to produce diffracted light and non-diffracted light, removing more than 70% of the non-diffracted light and collecting and directing the diffracted light and the not removed non-diffracted light by a projection optics box (POB) to expose a semiconductor wafer.

The present disclosure is also directed towards masks. In one embodiment, an EUV mask includes a low thermal expansion material (LTEM) layer, a reflective multilayer (ML) over one surface of the LTEM layer, a conductive layer over an opposite surface of the LTEM layer, a capping layer over the reflective ML, a buffer layer over the capping layer and an patterned absorption stack over the buffer layer. The patterned absorption stack defines a first, a second and a third states of the EUVL mask. Reflection coefficients of the first state, the second state, and the third state are $r_1$, $r_2$, and $r_3$, respectively. And $r_3$ is close to $(r_1+r_2)/3$. The mask also includes a first polygon located adjacent to a second polygon. The first polygon has the first state and the second polygon has the second state. The mask also includes a field (a region without polygon) having the third state.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet lithography (EUVL) system, comprising:
    an extreme ultraviolet (EUV) mask with three states having reflection coefficients r1, r2, and r3, respectively, wherein r3 is a pre-specified value that is a function of r1 and r2;
    an on-axis illumination (ONI) with partial coherence σ less than 0.3 to expose the EUV mask to produce diffracted light and non-diffracted light; and
    a projection optics box (POB) to remove a portion of the non-diffracted light and to collect and direct the diffracted light and the remaining non-diffracted light to expose a target.

2. The system of claim 1, wherein the EUV mask comprises:
    a low thermal expansion material (LTEM) layer;
    a reflective multilayer (ML) over one surface of the LTEM layer;
    a conductive layer over an opposite surface of the LTEM layer;
    a capping layer over the reflective ML;
    a buffer layer over the capping layer; and
    an absorption stack over the buffer layer, wherein the absorption stack comprises multiple layers.

3. The system of claim 2, wherein the absorption stack includes a top layer, a middle layer, and a bottom layer.

4. The system of claim 3, wherein the top and the bottom layers include molybdenum (Mo).

5. The system of claim 3, wherein the middle layer includes material from a group consisting of tantalum (Ta), tantalum nitride (TaN), and tantalum boron nitride (TaBN).

6. The system of claim 2, wherein the first state is configured as (from top to bottom) the buffer layer/the capping layer/the reflective ML/the LTEM layer.

7. The system of claim 2, wherein the second state is configured as (from top to bottom) the bottom layer of the absorption stack/the buffer layer/the capping layer/the reflective ML/the LTEM layer.

8. The system of claim 2, wherein the portion of the non-diffracted light is at least 70 %.

9. The system of claim 2, wherein the buffer layer is disposed directly over the capping layer.

10. The system of claim 1, wherein r3 is (r1+r2)/2.

11. The system of claim 1, wherein the first and the second states are assigned to adjacent polygons, while the third state is assigned to a field (a region without polygons).

12. An extreme ultraviolet lithography (EUVL) process, comprising:
    fabricating an extreme ultraviolet (EUV) mask, including:
        forming an absorption stack comprising two or more layers;
        removing a first portion of the absorption stack; and
        removing a second portion of the absorption stack, the second portion being different than the first portion;
        wherein the forming, the removing the first portion, and removing the second portion result in the EUV mask having a first state, a second state, and a third state with respective pre-specified reflection coefficients $r_1$, $r_2$, and $r_3$, wherein $r_3$ is a function of r1 and r2;
    exposing the EUV mask by an on-axis illumination (ONI) with partial coherence σ less than 0.3 to produce diffracted light and non-diffracted light; and
    collecting and directing the diffracted light and the not removed non-diffracted light by a projection optics box (POB) to expose a semiconductor wafer.

13. The process of claim 12, wherein fabricating the EUV mask further comprises:
    forming a first polygon;
    forming a second polygon adjacent to the first polygon;
    wherein the first state is assigned to the first polygon, the second state is assigned to the second polygon, and the third state is assigned to a field region free of the first and second polygons.

14. The process of claim 13, wherein the first polygon and the second polygon are circuit patterns.

15. The process of claim 12, wherein r3 is (r1+r2)/2.

16. The process of claim 12, wherein the absorption stack includes a top layer, a middle layer, and a bottom layer.

17. An extreme ultraviolet lithography (EUVL) system, comprising:

an extreme ultraviolet (EUV) mask with three states having reflection coefficients r1, r2, and r3, respectively, wherein r3 is approximately an average of r1 and r2;

an on-axis illumination (ONI) with partial coherence $\sigma$ less than 0.3 to expose the EUV mask to produce diffracted light and non-diffracted light; and a projection optics box (POB) to remove a portion of the non-diffracted light and to collect and direct the diffracted light and the remaining non-diffracted light to expose a target.

18. The system of claim 17, wherein the EUV mask comprises:

a low thermal expansion material (LTEM) layer;

a reflective multilayer (ML) over one surface of the LTEM layer;

a conductive layer over an opposite surface of the LTEM layer;

a capping layer over the reflective ML;

a buffer layer over the capping layer; and an absorption stack over the buffer layer, wherein the absorption stack comprises multiple layers.

19. The system of claim 17, wherein the first and the second states are assigned to adjacent polygons, while the third state is assigned to a field (a region without polygons).

20. The system of claim 19, wherein the adjacent polygons are circuit patterns.

* * * * *